United States Patent [19]

Nara et al.

[11] 4,223,327
[45] Sep. 16, 1980

[54] NICKEL-PALLADIUM SCHOTTKY JUNCTION IN A CAVITY

[75] Inventors: Aiichiro Nara; Hisao Kondo; Takeji Fujiwara; Hideaki Ikegawa, all of Amagasaki, Japan

[73] Assignee: Mitsubishi Denki Kabushiki Kaisha, Tokyo, Japan

[21] Appl. No.: 909,108

[22] Filed: May 24, 1978

Related U.S. Application Data

[63] Continuation of Ser. No. 736,813, Oct. 29, 1976, abandoned.

[30] Foreign Application Priority Data

Oct. 29, 1975 [JP] Japan .................................. 50-130269

[51] Int. Cl.² ........................................... H01L 29/48
[52] U.S. Cl. ...................................... 357/15; 357/55; 357/71
[58] Field of Search ...................... 357/15, 22, 55, 71

[56] References Cited

U.S. PATENT DOCUMENTS

| | | | |
|---|---|---|---|
| 3,349,297 | 10/1967 | Crowell et al. | 357/15 |
| 3,636,417 | 1/1972 | Kimura | 357/15 |
| 3,746,950 | 7/1973 | Kano et al. | 357/15 |
| 3,764,865 | 10/1973 | Napoli et al. | 357/15 |
| 3,777,228 | 12/1973 | Van Steenbergen et al. | 357/15 |
| 3,999,281 | 12/1976 | Goronicin et al. | 357/15 |

FOREIGN PATENT DOCUMENTS

903928  6/1972 Canada ..................................... 357/15

OTHER PUBLICATIONS

L. Esaki et al., "Schottky Diode," IBM Tech. Discl. Bull., vol. 11, #1, Jun. 1968, p. 19.
S. Magdo et al., "High-Speed EPI Field–Effect Devices," IBM Tech. Discl. Bull., vol. 14, #3, Aug. 1971, p. 751.
L. Freed et al., "Personalization . . . by Metallic Plugs," IBM Tech. Discl. Bull., vol. 15, #12, May 1973, pp. 3875–3896.

*Primary Examiner*—Joseph E. Clawson, Jr.
*Attorney, Agent, or Firm*—Oblon, Fisher, Spivak, McClelland & Maier

[57] ABSTRACT

A Schottky barrier semiconductor device comprising a semiconductor substrate having a hole in part of one of its main surfaces, a surface protecting film formed on the main surface and having a flange-like part extending over the edge of the hole, and a barrier metal formed on the entire wall of the hole including areas underneath the flange-like portion. The barrier metal film thus formed prevents concentration of an electric field at the edge of the interface between the barrier metal and the semiconductor substrate, thereby improving the reverse breakdown characteristics.

8 Claims, 13 Drawing Figures

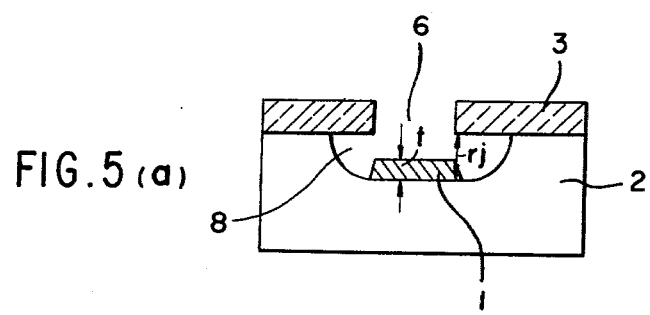
FIG.5(a)
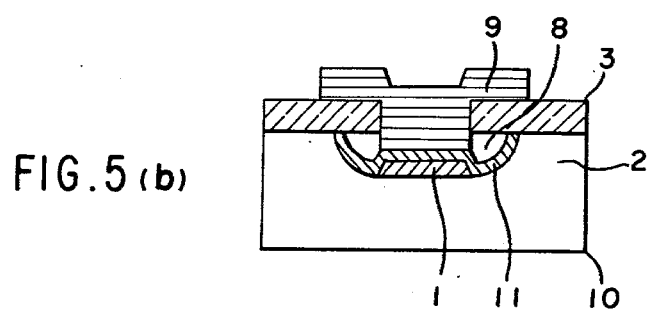
FIG.5(b)
FIG. 6
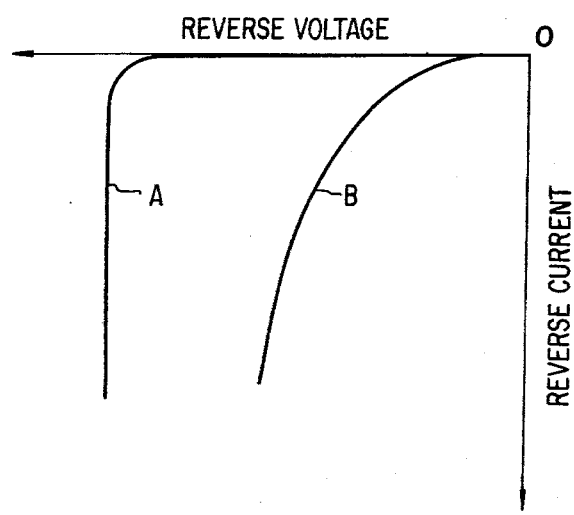

NICKEL-PALLADIUM SCHOTTKY JUNCTION IN A CAVITY

This is a continuation of application Ser. No. 736,813, filed Oct. 29, 1976, now abandoned.

BACKGROUND OF THE INVENTION

1. Field of the Invention

The present invention relates to Schottky barrier semiconductor devices having a high reverse breakdown voltage.

2. Description of Prior Art

The Schottky barrier diode (hereinafter briefly, SBD) has been widely known, comprising a metal and a semiconductor, wherein an electrostatic barrier is formed at the interface which causes the metal-semiconductor interface to have rectifying properties. SBD's have good high frequency characteristic and are operable with a small forward voltage drop. The recent development in metal-semiconductor contact techniques and semiconductor surface treatment techniques has enhanced efficiency in the production of SBD's, with the result that an increasing number of SBD's have come to be used for signal processing in a high frequency region, as well as for rectifying in power supply devices.

In practical applications, however, the use of SBD's is considerably limited because their reverse breakdown voltage is not high enough. As generally accepted, the low reverse breakdown voltage is referred chiefly to the structure of the SBD. A typical SBD is such that a surface protecting film made of an insulating material such as silicon oxide is formed on one main surface of a semiconductor substrate, and a barrier metal is brought into contact with the semiconductor substrate via an opening formed on the surface protecting film, thus forming a Schottky barrier in the metal-semiconductor interface. In such structure, as shown in FIG. 1, an electric field is readily concentrated in the periphery A in the interface between the barrier metal 1 and the semiconductor substrate 2, causing the reverse breakdown voltage to be lowered.

Several prior art approaches to this problem have been known, including the structure in which, as shown in FIG. 2(a), a p+ guard ring 4 is formed in the interface A between the barrier metal and the semiconductor substrate where an electric field is readily concentrated, and the structure in which, as shown in FIG. 2(b), a double-guard ring is formed by forming an n+ guard ring inside the p+ guard ring. Another prior art approach resorts to modifying the planar structure, one most practical example of which is shown in FIG. 2(c) in which the surface of a semiconductor substrate such as n-type silicon wafer is etched shallowly, i.e., to a depth of 2000 to 3000 Å, whereby charges and strain in the boundary between the semiconductor surface and the insulating film formed on the substrate are removed and thus lowering of the reverse breakdown voltage due to such boundary charges and strain is prevented. Another prior art approach is shown in FIG. 2(d) in which a hollow 6 is formed by etching to a depth rj (1 to 10 μm) on part of the main surface of a semiconductor substrate 2 such as n-type silicon wafer to hamper an electric field from being concentrated in the periphery of the interface between the barrier metal and the semiconductor and thereby to improve the reverse breakdown voltage.

In practice, however, the foregoing prior art structures are not very practicable for the following reasons. In the guard ring structure, although the reverse breakdown characteristic can be improved, the high frequency characteristic is impaired by the injection of minority carrier because a p+n junction is formed between the p+ guard ring 4 and the n-type silicon wafer 2. In the double guard ring structure, although the reverse breakdown characteristic can be improved, no substantial improvement in the high frequency characteristic is available because P+n and n+p+n junctions are formed between the guard ring and the semiconductor substrate. Furthermore, in the guard ring structure, the semiconductor substrate must be thicker as deeper the gurard ring is formed in the n-type silicon wafer substrate, and the distribution of impurity concentration in the substrate varies due to thermal diffusion process necessary for forming the guard ring, resulting in a large forward voltage drop. Further, the thermal diffusion process adds an extra work to the forming of the semiconductor device and leads to a rise in the production cost. In the structure in which the main surface of the semiconductor substrate is shallowly etched to preclude influences of boundary charges and strain upon improvement in the reverse breakdown characteristic, it is practically impossible to obtain substantial improvement in the reverse breakdown characteristic. Shallowly etching the semiconductor surface is not an efficient way of improving the reverse breakdown characteristic, or does not give a substantial solution to the problem ascribed to conditions under which the surface protecting film is formed. After all, the advantage available with this technique is not very significant or nothing better than that available with the known planar structure.

In the structure in which the surface of the semiconductor substrate is etched deep, the concentration of an electric field in the periphery of the interface between the barrier metal and the semiconductor substrate can be effectively reduced to enable the reverse breakdown voltage to be raised to a theoretically obtainable value. In experiments, this effect has been attested on PN junction planar devices.

In such structure, however, a flange-like portion 7 over the edge of the hollow remains as part of the surface protecting film 3 as shown in FIG. 2(e) after forming of the hollow by selectively etching the semiconductor substrate, with the result that the barrier metal 1 can hardly be bonded to the entire wall of the hollow and a void 8 where the barrier metal 1 is absent tends to be set up underneath the flange-like portion. This has made it difficult to realize substantial reverse breakdown characteristic better than one obtainable with the known planar devices. One prior art solution to this problem has been to resort to a method in which a barrier metal is bonded to the wall of the hollow by sputtering techniques called "dry plating".

According to this approach, however, it is difficult to make the condition for reducing the void compatible with the condition for forming the Schottky barrier and to establish substantial repeatability. To make the two conditions compatible with each other, a special sputtering apparatus must be used.

Another solution to the problem has been to remove the flange-like portion 7 by photoetching techniques. In practice, however, it is extremely difficult to remove only the flange-like portion exactly because the width of the flange-like portion is as small as several microns and can hardly be compensated for by the precision of the existing masking technique.

SUMMARY OF THE INVENTION

Accordingly, a first object of the present invention is to provide a Schottky barrier semiconductor device having good reverse breakdown characteristic realized by forming a barrier metal also on the semiconductor substrate underneath the flange-like portion.

A second object of the invention is to provide a method of efficiently fabricating Schottky barrier semiconductor devices having good reverse breakdown characteristic realized by forming a barrier metal on the semiconductor substrate underneath the flange-like portion by electroplating techniques.

With these and other objects in view, the present invention provides a Schottky barrier semiconductor device in which a barrier metal is formed also on the semiconductor substrate underneath the flange-like portion, thereby to hamper an electric field from being concentrated in the periphery of the interface between the barrier metal and the semiconductor substrate and thus improving the reverse breakdown voltage. According to the invention, the barrier metal can readily be deposited on the semiconductor substrate underneath the flange-like portion by electroplating techniques.

A Schottky barrier semiconductor device of the invention consists essentially of a semiconductor substrate having a hollow in part of its main surface, and a barrier metal formed in contact with the entire wall of the hollow of the semiconductor substrate.

A method of the invention for fabricating such Schottky barrier semiconductor device comprises: a step for forming a surface protecting film on one main surface of the semiconductor substrate; a step for forming an opening in part of the surface protecting film and thereby causing part of the main surface of the semiconductor substrate to be expose; a step for forming a hollow on the main surface of the semiconductor substrate by etching the exposed part of the main surface thereof by the use of an etching solution; and a step for depositing a barrier metal on the wall of the hollow by electroplating.

BRIEF DESCRIPTION OF THE DRAWING

FIGS. 5(a) and 5(b) are cross-sectional views showing another embodiment of the invention realized in steps shown in order; and FIG. 6 is a diagram showing the reverse voltage-current characteristic of a Schottky barrier semiconductor device of the invention, in comparison with that of a prior art equivalent Schottky barrier semiconductor device.

DETAILED DESCRIPTION OF THE INVENTION

Figure 1:
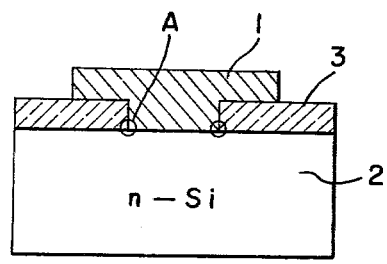
FIGS. 1 and 2(a) to 2(e) are cross-sectional views showing structures of prior art Schottky barrier semiconductor devices.
Figure 2:
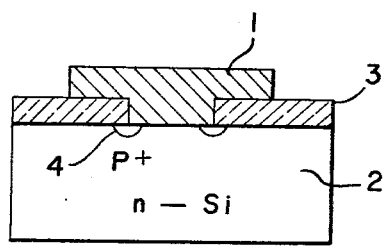
Figure 2:
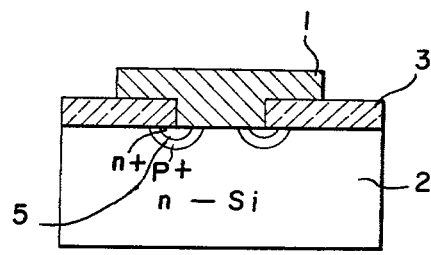
Figure 2:
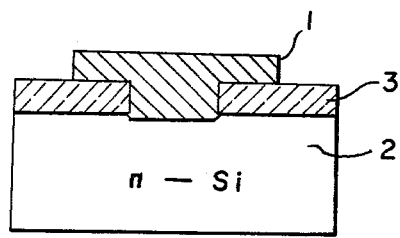
Figure 2:
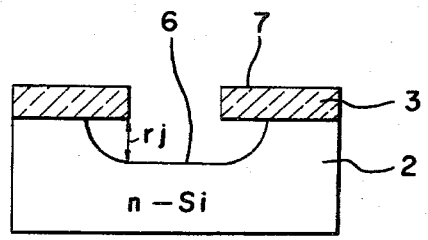
Figure 2:
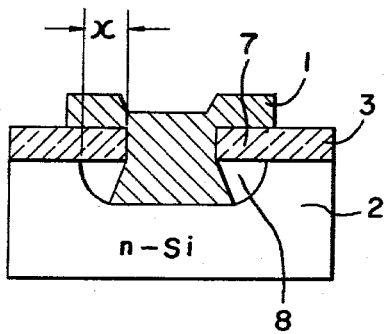
Figure 3:
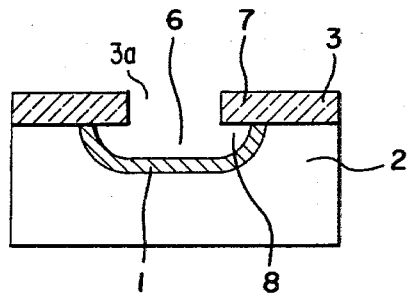
FIG. 3 is a cross-sectional view showing the structure of a Schottky barrier semiconductor device for the purpose of illustrating the principle of the invention.

With reference now to FIG. 3, there is shown a cross-sectional view of a Schottky barrier semiconductor device for the purpose of illustrating the principle of the present invention, which comprises a semiconductor substrate 2, a surface protecting film 3, and a barrier metal 1. The semiconductor substrate 2 may be made of any semiconductor such as typically of silicon; also, the semiconductor substrate 2 may be made of a III-V group compound semiconductor, a II-VI group compound semiconductor, or a IV group compound semiconductor. The semiconductor substrate 2 has main surfaces 1A and 1B opposite to each other. The surface protecting film 3 is of an electrical insulating material such as, for example, typically of silicon dioxide ($SiO_2$) and silicon nitride ($Si_3N_4$). The silicon dioxide film may be formed by vapor-phase growth, sputtering or thermal oxidation techniques, although the thermal oxidation technique is applicable only to the semiconductor substrate 2 made of silicon. The silicon nitride film may be formed by vapor-phase growth techniques. Thus the surface protecting film 3 is formed on the main surface 1A of the semiconductor substrate 2. An opening 3a is formed in a given part of the surface protecting film 3 by photoetching, where a part of the main surface 1A is exposed. The surface protecting film 3 is normally 0.5 to 2 $\mu$m thick. The exposed part of the semiconductor substrate is etched by an etching solution to form a hollow 6. When the semiconductor substrate is of silicon, the etching solution is prepared of hydro fluoric acid and nitric acid. Areas underneath the surface protecting film 3 near the opening 3a are also etched whereby a flange-like portion 7 is formed extending over the peripheral edge of the hollow 6. As a result, a void 8 is formed underneath the flange-like portion 7.

The barrier metal 1 is formed on the wall of the hollow 6 by electroplating in such manner that the barrier metal 1 is effectively bonded also to the portion directly beneath the flange-like portion 7, permitting the void 8 to be eliminated. The thickness of the barrier metal can be arbitrarily controlled by electroplating techniques; it is preferably between 500 to 5000 Å. If the thickness of the barrier metal film is below 500 Å, pinholes tend to be developed on the barrier metal film, causing a metal formed thereon to be diffused through pinholes into the semiconductor substrate 2. While, if the thickness of the barrier metal film is greater than 5000 Å, the strain in the electroplated barrier metal becomes large, causing the barrier metal film 1 to become loose.

In the electroplating process, the semiconductor substrate 2 having the surface protecting film 3 with an opening 3a is immersed in a solution consisting of nickel plating solution and palladium plating solution in a suitable ratio. An anode plate of palladium or carbon is placed in the plating solution opposite to the semiconductor substrate 2; the positive pole of a plating DC power supply is connected to the anode plate, and the negative pole thereof to the semiconductor substrate 2. This electroplating is advantageous in that the thickness of the barrier metal can easily be controlled.

Figure 4:
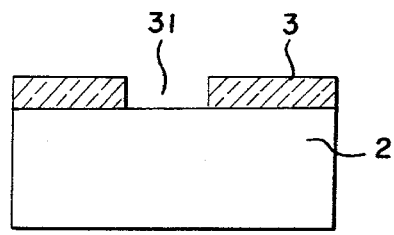
FIGS. 4(a) to 4(c) are cross-sectional views showing a Schottky barrier semiconductor device of one embodiment of the invention formed in steps shown in order.
Figure 4:
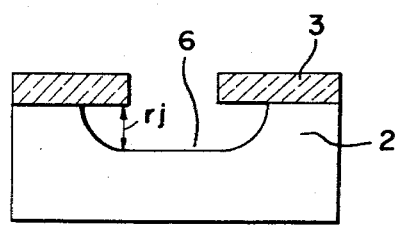
Figure 4:
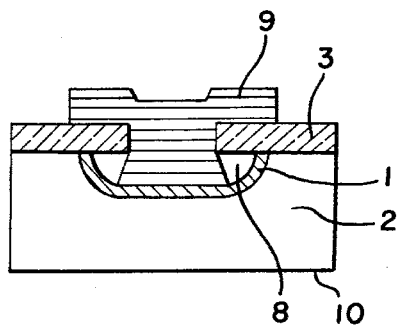

Concrete examples of the Schottky barrier semiconductor device of the invention will be described by referring to FIGS. 4(a) to 4(c). A surface protecting film 3 such as $SiO_2$ film is formed by thermal oxidation on one main surface 1A of a semiconductor substrate 2 such as n-type silicon wafer which has been washed in an organic solvent such as Trichlene. As shown in FIG. 4(a), an opening 3a is formed on the SiO$_2$ film 3 by photoetching. Through the opening 3a, the main surface 1A of the n-type silicon wafer 2 is exposed. The exposed part is etched by a known etching solution consisting of hydro fluoric acid and nitric acid, to form a hollow 6 (FIG. 4(b)). The depth rj of the hollow 6 is normally 1 to 10 μm. A barrier metal 1 is deposited on the wall of the hollow 6 by electroplating, with the silicon wafer 2 used as the cathode. The electroplating solution used is of nickel-palladium alloy plating solution. The barrier metal is formed to a thickness of 500 to 5000 Å. An electrode 9 is formed for facilitating external lead installation and for protecting the barrier metal 1. In forming the electrode 9, gold is used when it is formed by electroplating, or gold or aluminum is used when it is formed by vacuum vapor deposition techniques. The void 8 is not formed when the electrode is formed by electroplating. While, the void 8 is formed in the vacuum vapor deposition process as shown in FIG. 4(c). In the last step, an ohmic contact 10 of nickel is formed on the other main surface 1B of the n-type silicon wafer 2.

With reference to FIGS. 5(a) and 5(b), another Schottky barrier semiconductor device of the invention is shown in sectional views. The device is processed as in FIGS. 4(a) and 4(b), and then a barrier metal 1 is formed by known vacuum vapor phase deposition or sputtering techniques at least in the center part of a hollow 6 formed on an n-type silicon wafer 2. By using known photoetching process, the barrier metal 1 is left only in the center part of the hollow corresponding to the area underneath an opening 3a formed on a SiO$_2$ film. The thickness t of the barrier metal film is smaller than the depth rj of the hollow 6 to permit a nickel-palladium plating solution to readily enter a void 8. The barrier metal 1 is of molybdenum (Mo), platinum (Pt), tantalum (Ta), tungsten (W) or the like. The specimen is subjected to nickel-palladium alloy plating in the plating solution where the silicon wafer 2 serves as the negative pole, and a palladium or carbon plate as the positive pole. The barrier metal 11 of nickel-palladium alloy is formed on the barrier metal 1a which has been previously formed and on the wall of the hollow 6 in the part underneath the flange-like portion 7 of the SiO$_2$ film 3. In practice, the area of the wall of the hollow 6 underneath the flange-like portion 7 is considerably smaller than that of the wall of the hollow 6 underneath the opening 3a of the SiO$_2$ film. The barrier metal on the wall of the hollow 6 underneath the opening 3a is of material such as molybdenum which is highly resistant to heat, and the barrier metal on the wall of the hollow underneath the flange-like portion 7 is of material such as nickel-palladium alloy which can readily be bonded thereto by electroplating. Thus, barrier metal film 11 and 1 are formed on the entire wall of the hollow 6 of the silicon wafer 2. The use of a material which is highly resistant to heat as the barrier metal 1 serves to stabilize thermally the electrical characteristic of the Schottky barrier. Thus, according to the invention, the thermal characteristic of the device can be improved, in addition to the improvement in the reverse breakdown characteristic achieved as described by referring to FIG. 4. In the last step, an electrode 9 is formed by electroplating, vacuum vapor phase deposition or sputtering techniques, and then an ohmic electrode 10 is formed on the other main surface (FIG. 5(b)).

FIG. 6 is a diagram showing reverse voltage-current characteristic curves; the curve A for a SBD of the present invention, and the curve B for a prior art SBD. As apparent from the curves, the leak current is very small and the reverse breakdown voltage is very high in the SBD of the invention, as opposed to the fact that the leak current is large and the reverse breakdown voltage is low in the conventional SBD.

In the disclosed examples, an n-type silicon wafer is used for the semiconductor substrate. Instead of n-type silicon wafer, a p-type silicon wafer or other semiconductor wafer such as Ge or GaAs wafer may be used. Although the invention has been described in reference to Schottky barrier diodes, it is apparent that the invention is applicable to other semiconductor devices having a Schottky barrier electrode.

What is claimed as new and desired to secured by Letters Patent of the United States is:

1. A Schottky barrier semiconductor device comprising:
    a semiconductor substrate having a hollow in part of one of its main surfaces;
    a surface protecting film formed on said main surface and having a flange-like portion extended over the peripheral edge of said hollow; and
    a Schottky barrier forming metal bonded to the entire wall of said hollow without filling said hollow, wherein said barrier metal is formed of an alloy of nickel-palladium to a thickness of 500 to 5000 Å.

2. The Schottky barrier semiconductor device according to claim 1 wherein the wall of said hollow is curved.

3. The Schottky barrier semiconductor device according to claim 1 wherein said hollow is formed by etching.

4. The Schottky barrier semiconductor device according to claim 1 wherein said hollow is formed to a depth of 1 to 10 μm.

5. The Schottky barrier semiconductor device according to claim 1 wherein said barrier metal is formed by electroplating techniques.

6. A Schottky barrier semiconductor device comprising:
    a semiconductor substrate having a hollow in part of one of its main surfaces;
    a surface protecting film formed on said main surface and having a flange-like portion extended over the peripheral edge of said hollow;
    a first barrier metal formed of an alloy of nickel-palladium in part of said hollow excepting the side wall; and
    a second barrier metal formed on the side wall of said hollow and on the first barrier metal,
    wherein said second barrier metal is formed to a thickness of 500 to 5000 Å.

7. The Schottky barrier semiconductor device according to claim 6 wherein said first barrier metal is of material selected from nickel, molybdenum, platinum, tantalum, titanium and tungsten.

8. The Schottky barrier semiconductor device according to claim 6 wherein said second barrier metal is formed by electroplating technique.

* * * * *